(12) United States Patent
Nowak et al.

(10) Patent No.: US 6,424,174 B1
(45) Date of Patent: Jul. 23, 2002

(54) LOW LEAKAGE LOGIC GATES

(75) Inventors: Edward J. Nowak, Essex Junction, VT (US); Minh H. Tong, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,773

(22) Filed: Oct. 17, 2001

(51) Int. Cl.[7] .......................................... H03K 19/0185

(52) U.S. Cl. .............................. 326/81; 326/27; 326/87; 326/121

(58) Field of Search ............................... 326/26, 27, 80, 326/81, 83, 86, 87, 112, 119, 121

(56) References Cited

U.S. PATENT DOCUMENTS

| 5,483,188 | A | * | 1/1996 | Frodhsam | 327/170 |
| 6,236,244 | B1 | * | 5/2001 | Depetro et al. | 326/68 |
| 6,252,422 | B1 | * | 6/2001 | Patel et al. | 326/80 |

* cited by examiner

*Primary Examiner*—Don Phu Le
(74) *Attorney, Agent, or Firm*—Schmeiser, Olsen & Watts; Richard A. Henkler

(57) ABSTRACT

Disclosed is a static CMOS circuit having an input and an output, comprising: a pass gate switch fabricated from thick oxide devices coupled between the input and a fast CMOS circuit fabricated from thin oxide devices, the fast CMOS circuit coupled to the output; and a slow CMOS circuit fabricated from thick oxide devices coupled between the input and the output.

43 Claims, 6 Drawing Sheets

LOW LEAKAGE LOGIC GATES

BACKGROUND OF THE INVENTION

1. Field of the Invention

The present invention relates to the field of CMOS (complimentary-metal-oxidesilicon) integrated circuits; more specifically, it relates to a CMOS circuit design with increased tolerance to quantum mechanical tunneling or other gate leakage.

2. Background of the Invention

The shrinking of MOSFETs (metal-oxide-silicon-field-effect-transistor) in integrated circuits is based upon the concept of scaling. That is a large FET is scaled to produce a smaller FET with similar behavior. According to the scaling concept, decreasing the voltages and dimensions of an FET by 1/k and increasing the doping and charge densities by k will result in the electric field configuration inside the scaled FET remaining the same as in the unscaled FET. The result is in an increase in FET speed and a decrease by $1/k^2$ in power consumption, among other effects.

However, one serious limitation to the scaling model is quantum mechanical tunneling of electrons through very thin gate dielectrics. As the gate dielectric is made thinner the gate capacitance increases according to equation (1):

$$C = e/t_{ox} \quad (1)$$

where C is the gate capacitance per unit area, e is the dielectric constant of the gate dielectric and $t_{ox}$ is the thickness of the gate dielectric. This results in a total charge stored across the gate according to equation (2):

$$Q = CV$$

where Q is the charge stored across the gate, C is the gate capacitance and V is the gate voltage. While reduction in $T_{ox}$ increases the speed of the transistor, increased leakage due to tunneling through the gate insulator, results in increased power consumption.

FIG. 1 is a cross-sectional view of an FET illustrating tunneling current when the device is off. In FIG. 1, FET 100 includes a source 105 and a drain 110 formed in a silicon substrate 115. Formed between source 105 and drain 110 is a channel region 120. Formed over channel region 120 is a very thin gate dielectric 125. Formed on top of gate dielectric 125 is gate electrode 130. If FET 100 is an NFET, when a small ($V_{GATE}-V_{SOURCE}<V_{THESHOLD}$) positive potential is applied to gate electrode 130 with respect to the source (device off), a small leakage current IGS flows between the gate electrode and the source 105 and a small leakage current IGD flows between the gate electrode and the drain 110. If FET 100 is a PFET, when a negative potential is applied to gate electrode 130 with respect to its source (device off), a small leakage current IGS flows between the gate electrode and the source 105 and a small leakage current IGD flows between the gate electrode and the drain 110. Both IGS and IGD are due to quantum mechanical tunneling of electrons through gate dielectric 125.

FIG. 2 is a cross-sectional view of an FET illustrating tunneling current when the device is on. In FIG. 2, a voltage (positive for an NFET, negative for a PFET) has been applied to gate electrode 130 creating inversion layer 135 in channel region 120. Inversion layer 135 electrically connects source 105 to drain 110. In addition to the leakage currents IGS and IGD, a third leakage current IGC, flows from gate electrode 130 through gate dielectric 125 to inversion layer 135 and to substrate 115. IGC is due to quantum mechanical tunneling of electrons from gate 130 through gate dielectric 125. IGC is typically about 5X to 10X greater than IGS+IGD.

FIG. 3 is a plot of gate tunneling current vs. gate voltage as a function of gate dielectric thickness (SiO2.) For a 1.5 nm thick SiO2 gate and a gate voltage of 1.2 volts, the tunneling current through the gate dielectric is about 10 A/cm2. For a 1.0 nm thick SiO2 gate and a gate voltage of 1.2 volts, the tunneling current through the gate dielectric is about 1000 A/cm2. Clearly, a SiO2 gate-dielectric scaling limit exists. Therefore, for a typical CMOS circuit fabricated with very thin SiO2 gate dielectrics, nearly half the transistors, either the NFETs or the PFETs will exhibit a tunneling current during standby.

Circumventions to the scaling limit problem to date have been concentrated in the area of device physics employing non-conventional designs or materials. A circuit design that substantially mitigates the effect of tunneling leakage would extend the application of scaling for possibly one or two more conventional device generations.

BRIEF SUMMARY OF THE INVENTION

A first aspect of the present invention is a static CMOS circuit having an input and an output, comprising: a pass gate switch fabricated from thick oxide devices coupled between the input and a fast CMOS circuit fabricated from thin oxide devices, the fast CMOS circuit coupled to the output; and a slow CMOS circuit fabricated from thick oxide devices coupled between the input and the output.

A second aspect of the present invention is a static CMOS circuit having an input and an output, comprising: a pass gate switch fabricated from thick oxide devices coupled between the input and a fast CMOS circuit fabricated from thin oxide devices, the fast PCMOS circuit coupled to the output; a slow CMOS circuit fabricated from thick oxide devices coupled between the input and the output and a node; and a delay element coupled between the node and the output.

A third aspect of the present invention is an inverter having an input and an output, comprising: a pass gate switch fabricated from thick oxide devices coupled between the input and a fast inverter fabricated from thin oxide devices, the fast inverter coupled to the output; and a slow inverter fabricated from thick oxide devices coupled between the input and the output.

A fourth aspect of the present invention is an inverter having an input and an output, comprising: a pass gate switch fabricated from thick oxide devices coupled between the input and a fast inverter fabricated from thin oxide devices, the fast inverter coupled to the output; a slow inverter fabricated from thick oxide devices coupled between the input and the output and a node; and a delay element coupled between the node and the output.

A fifth aspect of the present invention is a NAND gate having a first and a second input and an output, comprising: a first pass gate switch fabricated from thick oxide devices coupled between the first input and a first input of a fast NAND gate fabricated from thin oxide devices, the fast NAND gate coupled to the output; a second pass gate switch fabricated from thick oxide devices coupled between the second input and a second input of the fast NAND gate; a slow NAND gate fabricated from thick oxide devices coupled between the first and the second inputs and the output.

A sixth aspect of the present invention is a static CMOS circuit having an input and an output, comprising: a fast CMOS circuit fabricated from thin oxide devices, the fast CMOS circuit having at least one input device, the fast CMOS circuit coupled to the output; a pass gate switch fabricated from thick oxide devices, the pass gate switch having one gate device coupled to each input device of the CMOS circuit, the pass gate switch coupled to the input; a slow CMOS circuit fabricated from thick oxide devices, coupled between the input and a node; and a delay element coupled between the node and the output.

A seventh aspect of the present invention is a static CMOS circuit having an input and an output, comprising: a fast CMOS circuit fabricated from thin oxide devices, the fast CMOS circuit having at least one input device, the fast CMOS circuit coupled to the output; a pass gate switch fabricated from thick oxide devices, the pass gate switch having one gate device coupled to each input device of the CMOS circuit, the pass gate switch coupled to the input; and a slow CMOS circuit fabricated from thick oxide devices, coupled between the input and the output.

An eighth aspect of the present invention is a static CMOS circuit having an input and an output, comprising: a fast CMOS circuit fabricated from thin oxide devices, the fast CMOS circuit having at least one input device, the fast CMOS circuit coupled to the output; a pass gate switch fabricated from thick oxide devices, the pass gate switch having one gate device coupled to each input device of the CMOS circuit, the pass gate switch coupled to the input; a slow CMOS circuit fabricated from thick oxide devices, coupled between the input and a node; and a delay element coupled between th de and the output.

BRIEF DESCRIPTION OF THE SEVERAL VIEWS OF THE DRAWINGS

The features of the invention are set forth in the appended claims. The invention itself, however, will be best understood by reference to the following detailed description of illustrative embodiments when read in conjunction with the accompanying drawings, wherein:

FIG. 2 is a cross-sectional view of an FET illustrating tunneling current when the device is on;

DETAILED DESCRIPTION OF THE INVENTION

Figure 4:
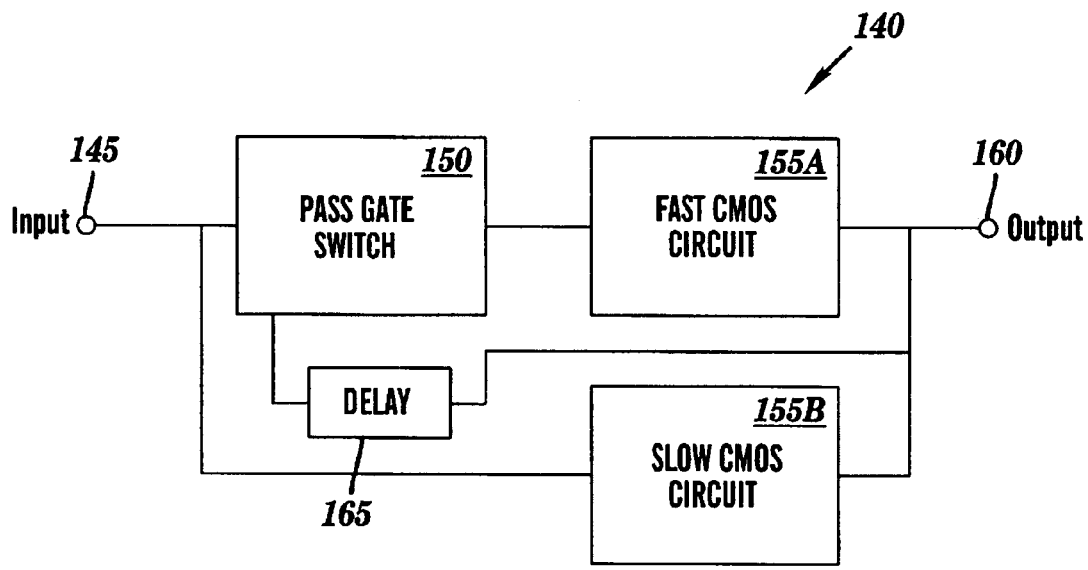
FIG. 4 is a schematic block diagram of a CMOS circuit according to a first embodiment of the present invention.

FIG. 4 is a schematic block diagram of a CMOS circuit according to a first embodiment of the present invention. Static CMOS circuit 140 includes an input 145 coupled to a pass gate switch 150, the pass gate switch coupled to a fast CMOS circuit 155A and the fast CMOS circuit coupled to an output 160. A slow CMOS circuit 155B is coupled between input 145 and output 160. A delay element 165 is coupled between pass gate switch 150 and output 160. Fast CMOS circuit 155A is fabricated with devices (NFETs and/or PFETs) having thin gate dielectrics and wide gate widths.

Figure 1:
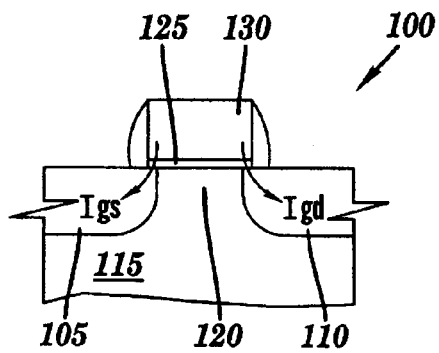
FIG. 1 is a cross-sectional view of an FET illustrating tunneling current when the device is off.
Figure 2:
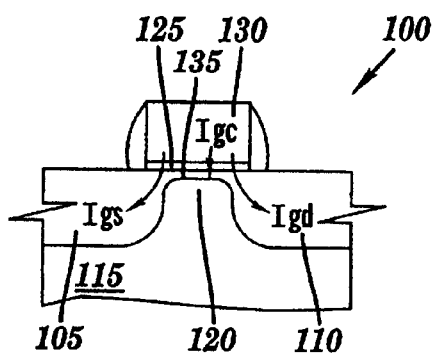
Figure 3:
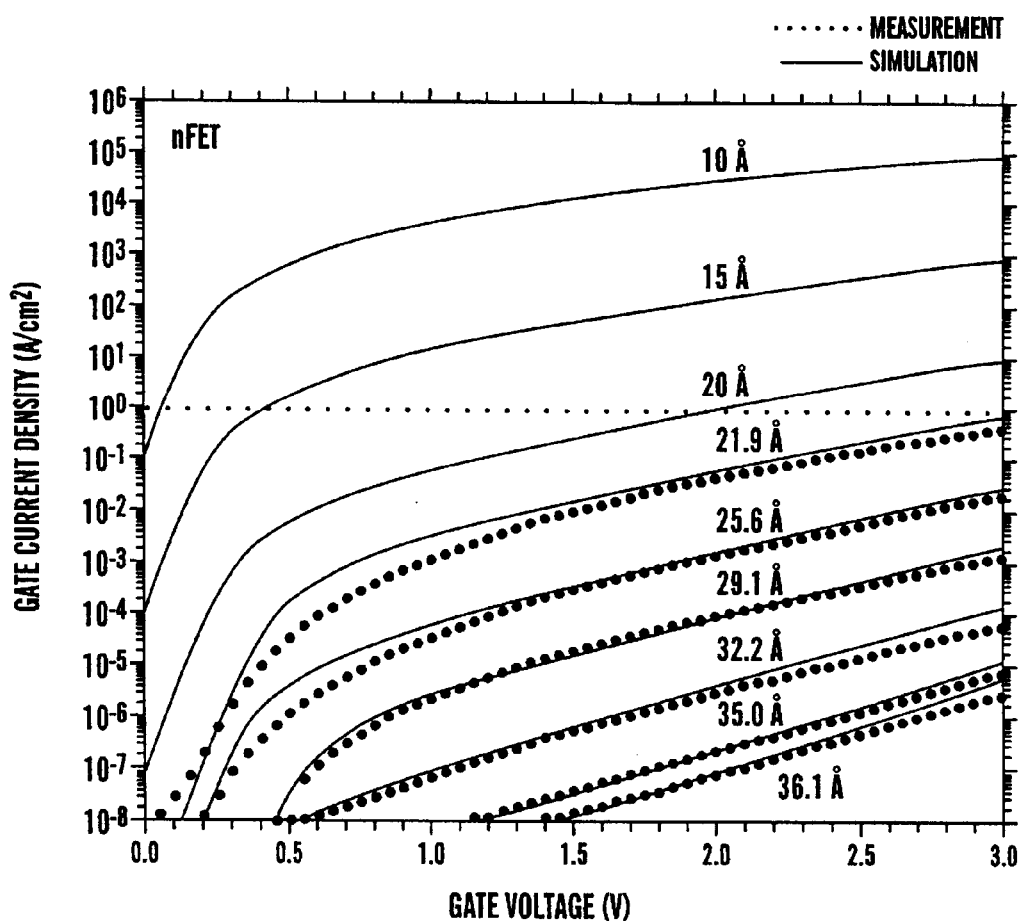
FIG. 3 is a plot of gate tunneling current vs. gate voltage as a function of gate dielectric thickness.

A thin gate dielectric is defined as a gate dielectric thin enough to have tunneling current comparable to or greater than the sub-threshold leakages of the MOSFETs involved. Referring to FIG. 3, the gate leakage (gate current density) of a physical gate dielectric thickness is a function of the applied gate voltage. A device having a physical gate thickness/gate voltage combination resulting in a gate current density of over 10–2 A/cm2 may be considered as having a thin gate dielectric. A wide gate is defined as a device having a gate width at least 10× its gate length.

Slow CMOS circuit 155B is identical to fast CMOS circuit 155A except the slow CMOS circuit is fabricated with devices (NFETs and/or PFETs) having thick gate dielectrics and narrow gate widths. The drive strength of the slow CMOS circuit is about 1/10 to 1/1000 that of the fast CMOS circuit. Slow CMOS circuit 155B is substantially slower (about 10 to 1000 times slower) than fast CMOS circuit 155A.

A thick gate dielectric is defined as a gate dielectric thick enough to have a gate dielectric tunneling current which is less than the sub-threshold leakages of the MOSFETs employed. Referring to FIG. 3, the gate leakage (gate current density) of a physical gate dielectric thickness is a function of the applied gate voltage. A device having a physical gate thickness/gate voltage combination resulting in a gate current density of 10–2 A/cm2 or less may be considered as having a thick gate dielectric. A narrow gate is defined as a device having a gate width less than 10× its gate length.

Pass gate switch 150 is also fabricated with devices (NFETs and/or PFETs) having thick gate dielectrics for high speed CMOS and narrow gate widths. There is one gate PFET in pass gate switch 150 for each PFET receiving an input signal in fast CMOS circuit 155A and one pass NFET in the pass gate switch for each NFET receiving an input signal in the fast CMOS circuit. The pass NFETs and pass PFETS in pass gate switch 150 gate input signals to fast CMOS circuit 155A. Pass gate switch 150 may also include devices for discharging the coupling between the pass gate switch and fast CMOS circuit 155A.

In one example, fast CMOS circuit 155A is fabricated with NFETs and PFETs having a SiO2 gate dielectric thickness of about 0.5 to 2.0 nm and a gate to width of about 0.1 to 10 microns, slow CMOS circuit 155B is fabricated with NFETs and PFETs having a SiO2 gate dielectric thickness of about 1.3 to 3.0 nm and a gate width of about 0.02 to 1.0 micron and pass gate switch 150 is fabricated with NFETs and PFETs having a SiO2 gate dielectric thickness of about 0.5 to 2.0 nm and a gate width of about 0.3 to 3.0 microns.

When an input signal is applied to input 145, pass gate switch 150 passes the input signal to fast CMOS circuit 155A and a corresponding output signal appears at output 160. If the polarity of the input signal is positive, then there will be a gate tunnel current flowing through the NFETs in fast CMOS circuit 155A. If the polarity of the input signal is negative (GND), then there will be a gate tunnel current flowing through the PFETs in fast CMOS circuit 155A. The input signal is also applied to slow CMOS circuit 155B, which reinforces the output signal from fast CMOS circuit 155A. The output signal is also applied to delay element 165. After a fixed delay, delay element 165 turns off the gate PFETs or the gate NFETs in pass gate switch 150 depending upon the polarity of the output signal. Turning off gate PFETs/NFETs in pass gate switch turns off fast CMOS circuit 155A. However, since slow CMOS circuit 155B is still on, the output signal does not change. (Slow CMOS circuit 155B is always on.) The delay in delay element 165 must exceed the amount of time it takes for slow CMOS circuit 155B to respond to the input signal. For example, if the thick oxide device propagation time were 20 pico-seconds, then a delay of 25 pico-seconds would work.

Figure 5:
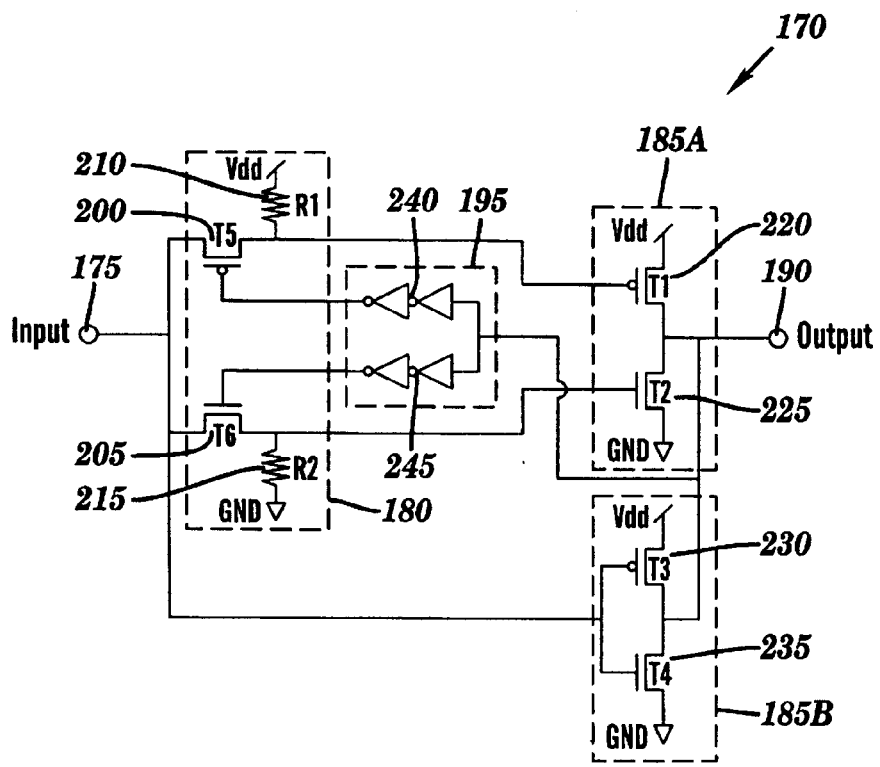
FIG. 5 is a schematic circuit diagram of a CMOS inverter circuit according to the first embodiment of the present invention.

FIG. 5 is a schematic circuit diagram of a CMOS inverter circuit according to the first embodiment of the present invention. In FIG. 5, inverter circuit 170 includes an input 175 coupled to a pass gate switch 180, coupled to a fast inverter 185A, which is coupled to an output 190. A slow inverter 185B is coupled between input 175 and output 190. A delay element 195 is coupled between pass gate switch 180 and output 190. Fast inverter 185A is fabricated with devices (NFETs and PFETs) having very thin gate dielectrics and wide gate widths. Slow inverter 185B is identical to fast inverter 185A except the slow inverter is fabricated with devices (NFETs and PFETs) having thick gate dielectrics and narrow gate widths. Pass gate switch 180 is also fabricated with devices (NFETs and PFETs) having thick gate dielectrics and narrow gate widths and does not use pass gates at the input of the tick-oxide transistors.

Pass gate 180 includes a PFET 200, an NFET 205, an optional first resistor 210 and an optional second resistor 215. Fast inverter 185A includes a PFET 220 and an NFET 225. Slow inverter 185B includes a PFET 230 and an NFET 235. Delay element 195 includes cascaded inverters 240 and 245. Cascaded inverters 240 and 245 are fabricated with thick oxide FETs. Cascaded invertors 240 and 245 include an even number of inverters so as not to invert the signal, only delay it.

The drains of PFET 200 and NFET 205 are coupled to input 175, as are the gates of PFET 230 and NFET 235. The source of PFET 200 is coupled to the gate of PFET 220 and the source of NFET 205 is coupled to the gate of NFET 225. The source of PFET 200 is optionally tied to VDD through optional first resistor 210 and the source of NFET 205 is optionally tied to GND through optional second resistor 215. The drains of PFETS 220 and 230 and of NFETs 225 and 235 are coupled to output 190. The sources of PFETs 220 and 230 are tied to VDD and the sources of NFETs 225 and 235 are tied to GND. The gate of PFET 200 is coupled to the output of cascaded inverter pair 240 and the gate of NFET 205 is coupled to the output of cascaded inverter pair 245A. The inputs of cascaded inverter pairs 240 and 245 are coupled to output 190.

Assume during standby, input 175 is low and output 190 is high. PFET 230 is on, NFET 235 is off, NFET 205 is on, PFET 200 is off. Further, PFET 220 and NFET 225 are both off; their respective gates having been pulled to VDD by gate tunnel current or optional first resistor 210 and to GND by input 275 via NFET 205, respectively. Therefore, since both PFET 220 and NFET 225 of fast inverter 185A are off, there is no significant gate tunneling current.

When input 175 switches high NFET 225 turns on fast (since NFET 205 was on) and output 190 goes low. NFET 235 turns on and PFET 230 turns off. After a fixed delay, caused by delay element 195, NFET 205 turns off and PFET 200 turns on. The charge on the gate of NFET 225 bleeds to GND through gate tunnel current or optional second resistor 215 and NFET 225 turns off. Output 190 is held low by slow inverter 185B. Since both PFET 220 and NFET 225 of fast inverter 185A are off, there is again no significant gate tunneling current. Gate tunneling current occurred only for the short period of time, compared to a typical CMOS circuit duty cycle, that fast inverter 185A was on.

When input 175 switches low PFET 220 turns on fast (since PFET 200 was on) and output 190 goes high. PFET 230 turns on and NFET 235 turns off. After a fixed delay, caused by delay element 195, PFET 200 turns off and NFET 205 turns on. The charge on the gate of PFET 220 bleeds to VDD through tunnel current in the gate of PFET 220, or through optional first resistor 210 and PFET 220 turns off. Output 190 is held high by slow inverter 185B. Since both PFET 220 and NFET 225 of fast inverter 185A are off, there is again no significant gate tunneling current.

In delay element 195, cascaded inverter pair 240 coupled to the gate of PFET 200 and cascaded inverter pair 245 coupled to the gate of NFET 205 to allow for the capability for slightly different delays to be applied to each transistor. However, the delay of both cascaded inverter pairs may be the same or only a single cascaded inverter pair may be employed, the output of the single cascaded inverter pair feeding the gates of both transistors.

Figure 6:
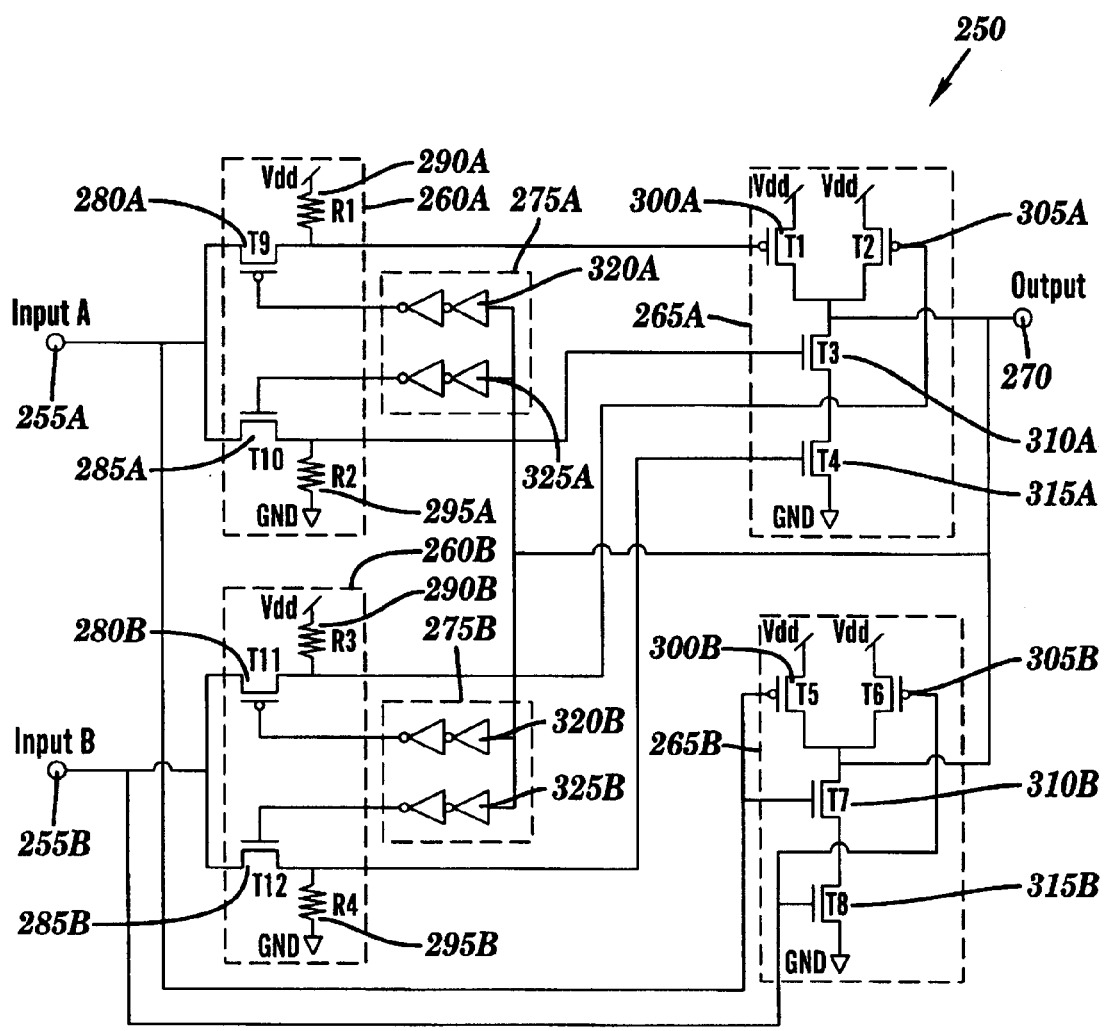
FIG. 6 is a schematic circuit diagram of a CMOS NAND gate according to the first embodiment of the present invention.

FIG. 6 is a schematic circuit diagram of a CMOS NAND gate according to the first embodiment of the present invention. In FIG. 6, NAND gate 250 includes a first input 255A coupled to a first pass gate switch 260A, which is coupled to a fast NAND gate 265A, which is coupled to an output 270. A second input 225B is coupled to a second pass gate switch 260B, which is also coupled to fast NAND gate 265A. A slow NAND gate 265B is coupled between first input 255A and output 270. Slow NAND gate 265B is also coupled to second input 255B. A first delay element 275A is coupled between first pass gate switch 260A and output 270. A second delay element 275B is coupled between second pass gate switch 260B and output 270. Fast NAND gate 265A is fabricated with devices (NFETs and PFETs) having very thin gate dielectrics and wide gate widths. Slow NAND gate 265B is identical to fast NAND gate 265A except the slow NAND gate is fabricated with devices (NFETs and PFETs) having thick gate dielectrics and narrow gate widths. First and second pass gate switches 275A and 275B are fabricated with devices (NFETs and PFETs) having thick gate dielectrics and narrow gate widths.

First pass gate 260A includes a PFET 280A, an NFET 285A, an optional first resistor 290A and an optional second resistor 295A. Second pass gate 260B includes a PFET 280B, an NFET 285B, an optional third resistor 290B and an optional fourth resistor 295B. Fast NAND gate 265A includes a first PFET 300A, a second PFET 305A, a first NFET 310A and a second NFET 315A. Slow NAND gate 265B includes a first PFET 300B, a second PFET 305B, a first NFET 310B and a second NFET 315B. First delay element 275A includes cascaded inverters 320A and 325A. Second delay element 275B includes cascaded inverters 320B and 325B Cascaded inverters 320A, 325A, 320B and 325B are fabricated with thick oxide FETs.

The drains of PFET 280A and NFET 285A are coupled to first input 225A, as are the gates of PFET 300B and NFET 310B. The drains of PFET 280B and NFET 285B are coupled to second input 225B, as are the gates of PFET 305B and NFET 315B. The source of PFET 280A is coupled to the gate of PFET 300A and the source of NFET 285A is coupled to the gate of NFET 310A. The gates of PFET 300A and NFET 310A are the first input to fast NAND gate 265A. The source of PFET 280A is optionally tied to VDD through optional first resistor 290A and the source of NFET 285A is optionally tied to GND through optional second resistor 295A. The source of PFET 280B is coupled to the gate of PFET 305A and the source of NFET 285B is coupled to the gate of NFET 315A. The gates of PFET 305A and NFET 315A are the second input to fast NAND gate 265A The source of PFET 280B is optionally tied to VDD through optional third resistor 290B and the source of NFET 285B is optionally tied to GND through optional fourth resistor 295B. The drains of PFETS 300A and 305A are coupled to the drain of NFET 310A and to output 270. The sources of PFETs 300A and 305A are tied to VDD. The source of NFET 310A is coupled to the drain of NFET 315A and the source of NFET 315A is tied to GND. The drains of PFETS 300B and 305B are coupled to the drain of NFET 310B and to output 270. The sources of PFETs 300B and 305B are tied to VDD. The source of NFET 310B is coupled to the drain of NFET 315B and the source of NFET 315B is tied to GND. The gate of PFET 280A is coupled to the output of cascaded inverter pair 320A and the gate of NFET 285A is coupled to the output of cascaded inverter pair 325A. The gate of PFET 280B is coupled to the output of cascaded inverter pair 320B and the gate of NFET 285B is coupled to the output of cascaded inverter pair 325B. The inputs of cascaded inverter pairs 320A, 325A, 320B and 325B are coupled to output 270.

In operation, when output 270 is at VDD (high, all of the pass gate PFETs are switched off, thereby allowing the PFET gates in the fast NAND to settle at VDD, and hence largely eliminating the gate tunnel currents that would ordinarily be present from these PFETs. Of the four possible states of inputs 255A and 255B, three will result in no gate tunnel current and one will. The one case occurs when input 255A is at GND (low) and input 255B is at VDD while output 270 is at VDD. Since the pass gate NFETS 285A and 285B are on, there can be tunnel current from one of the fast NAND NFETs, 310A or 315A, but not both. Thus, in the case of a 2-input NAND gate tunneling current is reduced by about 75% to 100% depending on the input conditions.

Similarly, when output 270 is at GND (low), all of the pass gate NFETs are switched off, thereby allowing the NFET gates in the FAST NAND to settle at GND, and hence largely eliminating the gate currents that would ordinarily be present from the thin-oxide NFETs. In this case, since both inputs, 255A and 255B must be at VDD to achieve this output state, there is also no PFET gate-to-source voltage and, hence, very little PFET gate-oxide tunnel current as well. In this state, the circuit highly suppresses the static gate-oxide tunnel leakage.

In delay element 275A, cascaded inverter pair 320A is coupled to the gate of PFET 280A and cascaded inverter pair 325A is coupled to the gate of NFET 285A in order to allow for the capability for slightly different delays to be applied to each transistor. However, the delay of both cascaded inverter pairs may be the same or only a single cascaded inverter pair may be employed, the output of the single cascaded inverter pair feeding the gates of both transistors. In delay element 275B, cascaded inverter pair 320B is coupled to the gate of PFET 280B and cascaded inverter pair 325B is coupled to the gate of NFET 285B in order to allow for the capability for slightly different delays to be applied to each transistor. However, the delay of both cascaded inverter pairs may be the same or only a single cascaded inverter pair may be employed, the output of the single cascaded inverter pair feeding the gates of both transistors.

PFETs 280A and 280B may be fed from a first cascaded inverter and NFETs 285A and 285B may be fed from a second dual inverter, or PFETs 280A and 280B and NFETs 285A and 285B may be fed from a single dual inverter.

Figure 7:
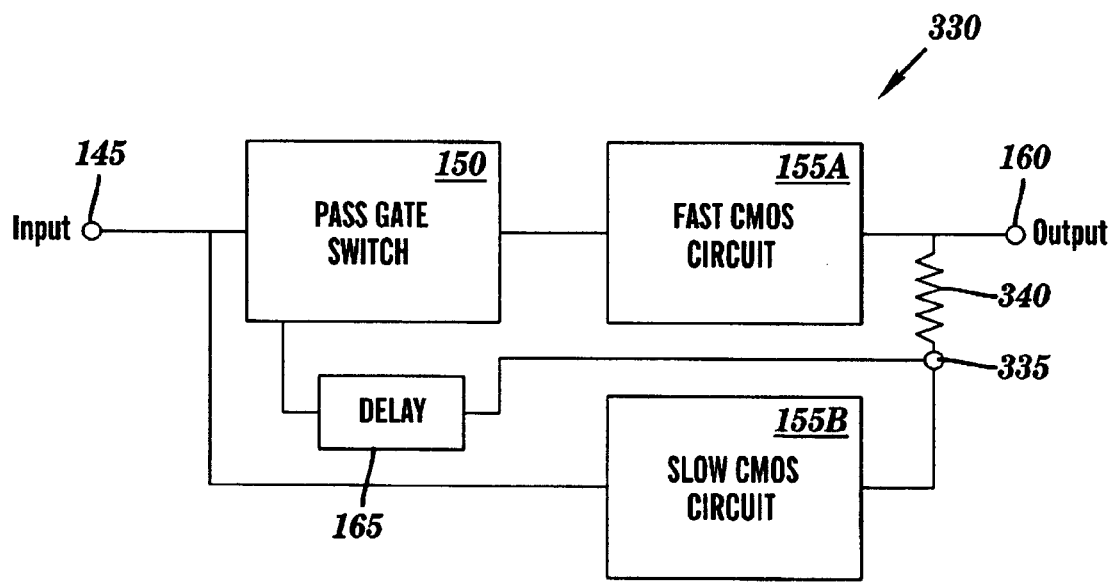
FIG. 7 is a schematic block diagram of a CMOS circuit 330 according to a second embodiment of the present invention.

FIG. 7 is a schematic block diagram of a CMOS circuit 330 according to a second embodiment of the present invention. A first difference between static CMOS circuit 140, illustrated in FIG. 4 and described above, and static CMOS circuit 330, is the addition of an slow CMOS circuit output node 335 and a resistor 340 between the slow CMOS circuit output node and output 160. A second difference is that delay element 165 is coupled between pass gate switch 150 and slow CMOS circuit output node 335 instead of directly to output node 160. Resistor 340 is a delay element, the magnitude of the delay selected to ensure fast CMOS circuit 155A is not de-powered before slow CMOS circuit 155B can switch, preventing a flip to the previous output state.

Figure 8:
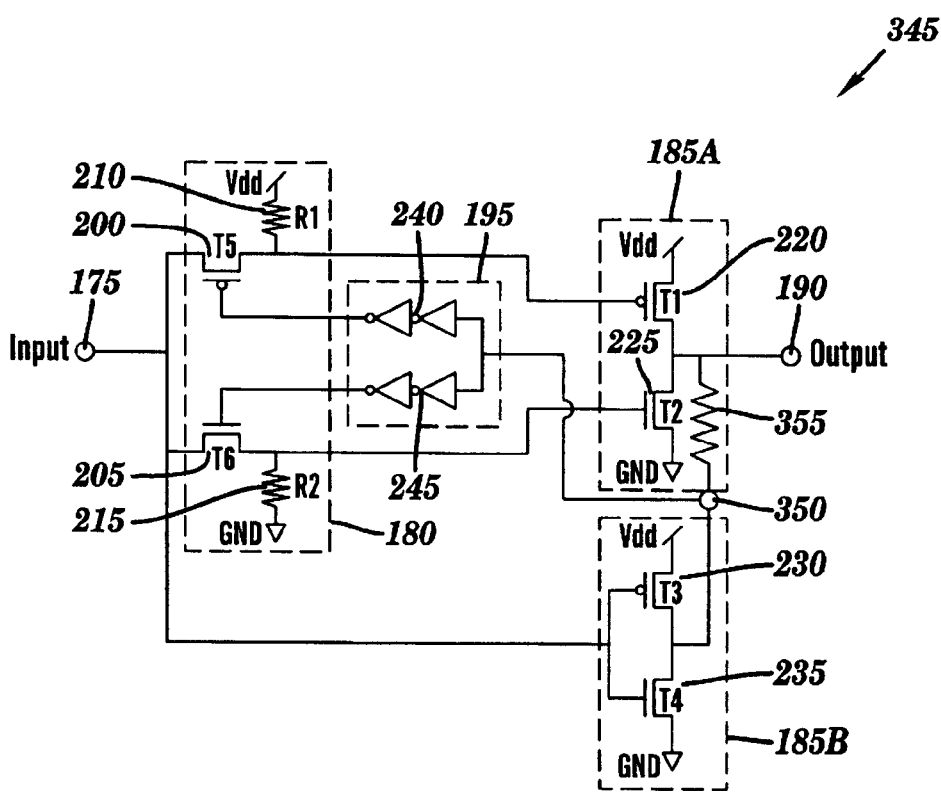
FIG. 8 is a schematic circuit diagram of a CMOS inverter 345 according to the second embodiment of the present invention.

FIG. 8 is a schematic circuit diagram of a CMOS inverter 345 according to the second embodiment of the present invention. A first difference between inverter 170, illustrated in FIG. 6 and described above, and inverter 345, is the addition of a slow inverter output node 350 and a resistor 355 between the slow inverter output node and output 190. A second difference is that delay element 195 is coupled between pass gate switch 180 and slow inverter output node 350 instead of directly to output node 190. Resistor 355 is a delay element, the magnitude of the delay selected to ensure fast inverter 185A is not de-powered before slow inverter 185B can switch, preventing a flip to the previous output state.

Figure 9:
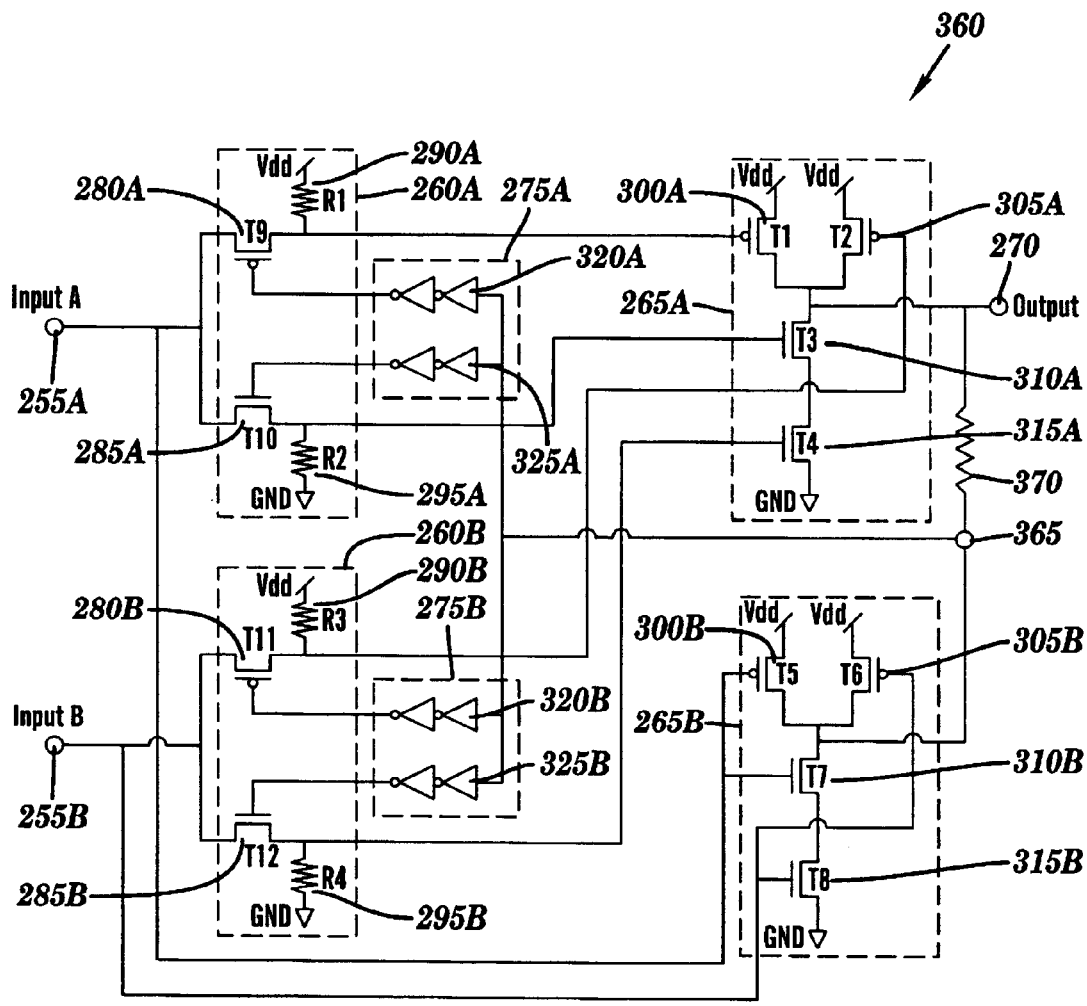
FIG. 9 is a schematic circuit diagram of a CMOS NAND gate 360 according to the second embodiment of the present invention.

FIG. 9 is a schematic circuit diagram of a CMOS NAND gate 360 according to the second embodiment of the present invention. A first difference between NAND gate 170, illustrated in FIG. 5 and described above, and NAND gate 360, is the addition of a slow NAND gate output node 365 and a resistor 370 between the slow NAND gate output node and output 270. A second difference is that delay elements 275A and 275B are coupled between pass gate switches 275A and 275B, respectively, and slow NAND gate output node 365 instead of directly to output node 270. Resistor 370 is a delay element, the magnitude of the delay selected to ensure fast NAND gate 265A is not de-powered before slow NAND gate 265B can switch, preventing a flip to the previous output state.

Figure 10:
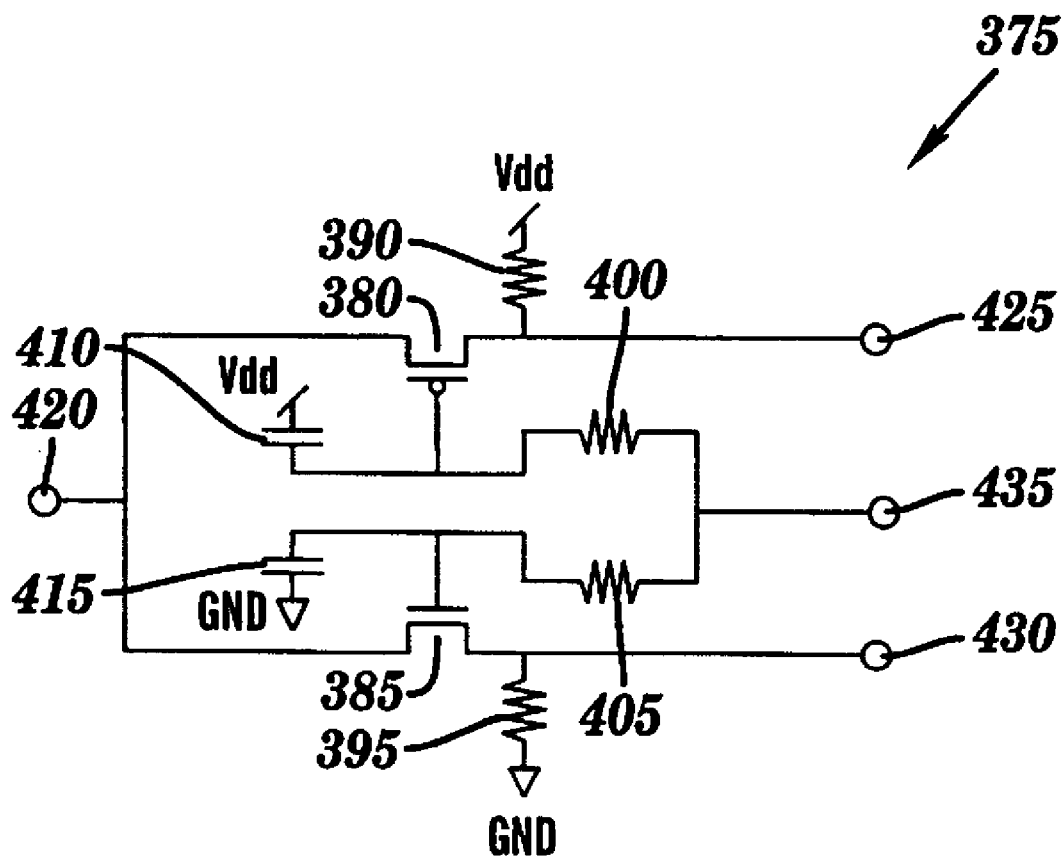
FIG. 10 is a schematic circuit diagram of an alternative pass gate switch/delay element according to the present invention.

FIG. 10 is a schematic circuit diagram of an alternative pass gate switch/delay element according to the present invention. In FIG. 10, pass gate switch 375 includes a PFET 380, an NFET 385, an optional first resistor 390, an optional second resistor 395, an optional third resistor 400 a fourth resister 405, a first capacitor 410 and a second capacitor 415. The drains of PFET 380 and NFET 385 are coupled to an input 420. The source of PFET 380 is coupled to a first node 425 and is optionally tied to VDD through optional first resistor 390. First node 425 ties to the gate of a fast CMOS circuit PFET. The source of NFET 375 is coupled to a second node 430 and is optionally tied to GND through optional second resistor 395. Second node 430 ties to the gate of the fast CMOS circuit NFET. Third resistor 400 is coupled between the gate of PFET 380 and a third node 435. First capacitor 410 is coupled between VDD and the gate of PFET 380. Fourth resistor 405 is coupled between the gate of NFET 385 and third node 435. Second capacitor 415 is coupled between GND and the gate of NFET 385. Third node 435 ties to the output of a slow CMOS circuit and directly or through a resistor to the output of the fast CMOS circuit.

Third resistor 400 and first capacitor 410 create a first RC delay between third node 435 and the gate of PFET 380. In one example, first capacitor 410 is provided by the internal capacitance of the gate of PFET 380. Fourth resistor 405 and second capacitor 415 create a second RC delay between third node 435 and the gate of NFET 385. In one example, second capacitor 415 is provided by the internal capacitance of the gate of NFET 385.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the invention may be applied to other CMOS gates besides Inverters and NAND gates, such as AND gates, OR gates, NOR gates and XOR gates. Further, the gates may have any number of inputs. Therefore, it is intended that the following claims cover all such modifications and changes as fall within the true spirit and scope of the invention.

What is claimed is:

1. A static CMOS circuit having an input and an output, comprising:
    a pass gate switch fabricated from thick oxide devices coupled between said input and a fast CMOS circuit fabricated from thin oxide devices, said fast CMOS circuit coupled to said output; and
    a slow CMOS circuit fabricated from thick oxide devices coupled between said input and said output.

2. The circuit of claim 1, further including a delay element coupled between said output and said pass gate switch.

3. The circuit of claim 2, wherein said delay element comprises an even number of inverters.

4. The circuit of claim 3, wherein said pair of inverters are fabricated from thick oxide devices.

5. The circuit of claim 2, wherein said delay element comprises a resistor and a capacitor.

6. The circuit of claim 5, wherein said capacitor is the internal gate capacitor of a pass gate switch device.

7. A static CMOS circuit having an input and an output, comprising:
    a pass gate switch fabricated from thick oxide devices coupled between said input and a fast CMOS circuit fabricated from thin oxide devices, said fast CMOS circuit coupled to said output;
    a slow CMOS circuit fabricated from thick oxide devices coupled between said input and said output and a node; and
    a delay element coupled between said node and said output.

8. The circuit of claim 7, further including a second delay element coupled between said node and said pass gate switch.

9. The circuit of claim 8, wherein said second delay element comprises an even number of inverters.

10. The circuit of claim 9, wherein said pair of inverters are fabricated from thick oxide devices.

11. The circuit of claim 8, wherein said second delay element comprises a resistor and a capacitor.

12. The circuit of claim 11, wherein said capacitor is the internal gate capacitor of a pass gate switch device.

13. The circuit of claim 7, wherein said delay element is a resistor.

14. An inverter having an input and an output, comprising:
    a pass gate switch fabricated from thick oxide devices coupled between said input and a fast inverter fabricated from thin oxide devices, said fast inverter coupled to said output; and
    a slow inverter fabricated from thick oxide devices coupled between said input and said output.

15. The inverter of claim 14, further including a delay element coupled between said output and said pass gate switch.

16. The inverter of claim 15, wherein said delay element comprises an even number of inverters.

17. The inverter of claim 16, wherein said pair of inverters are fabricated from thick oxide devices.

18. The inverter of claim 15, wherein said delay element comprises a resistor and a capacitor.

19. The inverter of claim 18, wherein said capacitor is the internal gate capacitor of a pass gate switch device.

20. An inverter having an input and an output, comprising:
    a pass gate switch fabricated from thick oxide devices coupled between said input and a fast inverter fabricated from thin oxide devices, said fast inverter coupled to said output;
    a slow inverter fabricated from thick oxide devices coupled between said input and said output and a node; and
    a delay element coupled between said node and said output.

21. The inverter of claim 20, further including a second delay element coupled between said node and said pass gate switch.

22. The inverter of claim 21, wherein said second delay element comprises an even number of inverters.

23. The inverter of claim 22, wherein said pair of inverters are fabricated from thick oxide devices.

24. The inverter of claim 21, wherein said second delay element comprises a resistor and a capacitor.

25. The inverter of claim 24, wherein said capacitor is the internal gate capacitor of a pass gate switch device.

26. The inverter of claim 20, wherein said delay element is a resistor.

27. A NAND gate having a first and a second input and an output, comprising:
    a first pass gate switch fabricated from thick oxide devices coupled between said first input and a first input of a fast NAND gate fabricated from thin oxide devices, said fast NAND gate coupled to said output;
    a second pass gate switch fabricated from thick oxide devices coupled between said second input and a second input of said fast NAND gate;
    a slow NAND gate fabricated from thick oxide devices coupled between said first and said second inputs and said output.

28. The NAND gate of claim 27, further including a delay element coupled between said output and said first and said second pass gate switches.

29. The NAND gate of claim 28, wherein said delay element comprises an even number of inverters.

30. The NAND gate of claim 29, wherein said pair of inverters are fabricated from thick oxide devices.

31. The NAND gate of claim 28, wherein said delay element comprises a resistor and a capacitor.

32. The NAND gate of claim 31, wherein said capacitor is the internal gate capacitor of a pass gate switch device.

33. A NAND gate having a first and a second input and an output, comprising:

a first pass gate switch fabricated from thick oxide devices coupled between said first input and a first input of a fast NAND gate fabricated from thin oxide devices, said fast NAND gate coupled to said output;

a second pass gate switch fabricated from thick oxide devices coupled between said second input and a second input of said fast NAND gate;

a slow NAND gate fabricated from thick oxide devices coupled between said first and said second inputs and a node; and a delay element coupled between said node and said output.

34. The NAND gate of claim 33, further including a second delay element coupled between said node and said first and second pass gate switches.

35. The NAND gate of claim 34, wherein said second delay element comprises an even number of inverters.

36. The NAND gate of claim 35, wherein said pair of inverters are fabricated from thick oxide devices.

37. The NAND gate of claim 34, wherein said second delay element comprises a resistor and a capacitor.

38. The NAND gate of claim 37, wherein said capacitor is the internal gate capacitor of a pass gate switch device.

39. The NAND gate of claim 33, wherein said delay element is a resistor.

40. A static CMOS circuit having an input and an output, comprising:

a fast CMOS circuit fabricated from thin oxide devices, said fast CMOS circuit having at least one input device, said fast CMOS circuit coupled to said output;

a pass gate switch fabricated from thick oxide devices, said pass gate switch having one gate device coupled to each input device of said CMOS circuit, said pass gate switch coupled to said input; and a slow CMOS circuit fabricated from thick oxide devices, coupled between said input and said output.

41. The circuit of claim 40, further including a delay element coupled between said output and each pass gate device.

42. A static CMOS circuit having an input and an output, comprising:

a fast CMOS circuit fabricated from thin oxide devices, said fast CMOS circuit having at least one input device, said fast CMOS circuit coupled to said output;

a pass gate switch fabricated from thick oxide devices, said pass gate switch having one gate device coupled to each input device of said CMOS circuit, said pass gate switch coupled to said input;

a slow CMOS circuit fabricated from thick oxide devices, coupled between said input and a node; and a delay element coupled between said node and said output.

43. The circuit of claim 42, further including a second delay element coupled between said output and each pass gate device.

* * * * *